United States Patent
Sirito-Olivier et al.

(10) Patent No.: US 7,123,091 B2
(45) Date of Patent: Oct. 17, 2006

(54) DARLINGTON DIFFERENTIAL AMPLIFIER

(75) Inventors: Philippe Sirito-Olivier, Carro par Martigues (FR); Pietro Antonio Calo', Laterza (IT)

(73) Assignees: STMicroelectronics S.r.l., Agrate Brianza (IT); STMicroelectronics SA, Montrouge (FR)

( * ) Notice: Subject to any disclaimer, the term of this patent is extended or adjusted under 35 U.S.C. 154(b) by 64 days.

(21) Appl. No.: 10/944,531

(22) Filed: Sep. 17, 2004

(65) Prior Publication Data
US 2005/0104659 A1     May 19, 2005

(30) Foreign Application Priority Data
Sep. 18, 2003 (IT) .................. VA2003A0035

(51) Int. Cl.
  *H03F 3/45* (2006.01)
  *H03G 3/12* (2006.01)
(52) U.S. Cl. ..................... 330/252; 330/283
(58) Field of Classification Search ........... 330/283, 330/310
See application file for complete search history.

(56) References Cited

U.S. PATENT DOCUMENTS

| | | | | | |
|---|---|---|---|---|---|
| 3,628,168 | A | * | 12/1971 | Kobayashi | 330/69 |
| 4,779,057 | A | * | 10/1988 | Woo | 330/149 |
| 4,890,067 | A | * | 12/1989 | Lamb | 330/149 |
| 5,461,342 | A | * | 10/1995 | Crabtree | 330/252 |

* cited by examiner

*Primary Examiner*—Robert Pascal
*Assistant Examiner*—Alan Wong
(74) *Attorney, Agent, or Firm*—Lisa K. Jorgenson; Allen, Dyer, Doppelt, Milbrath & Gilchrist, P.A.

(57) ABSTRACT

A Darlington differential amplifier includes a differential pair of Darlington transistors, with each pair including a first transistor and a second transistor connected in cascade to the first transistor. The first transistor is controlled by an externally generated voltage and drives the second transistor. The first and second transistors each include first and second conducting terminals, with the first conducting terminals being connected together and forming an output node of the amplifier. A first degeneration impedance is connected between the second conduction terminals of the second transistors in the pair of Darlington transistors. A second degeneration impedance is connected between the second conduction terminals of the first transistors in the pair of Darlington transistors for reducing harmonic distortion of the amplifier.

24 Claims, 3 Drawing Sheets

FIG. 2

DARLINGTON DIFFERENTIAL AMPLIFIER

FIELD OF THE INVENTION

The invention relates in general to amplifiers, and more particularly, to a Darlington differential amplifier with improved performance in terms of reducing harmonic distortion of the amplified signal.

BACKGROUND OF THE INVENTION

In many applications it is desirable to have high gain amplifiers, and at the same time have a linear transfer characteristic to prevent distortions of the signal to be amplified. An architecture of a differential amplifier commonly used in communication systems, in which these requirements are particularly desired, is a Darlington differential amplifier as shown in FIG. 1.

The illustrated Darlington differential amplifier is formed with bipolar transistors. The bipolar transistors may be replaced with MOSFETs and the following discussion still holds.

The amplifier is substantially formed by a pair of Darlington transistors QD1, Q1, QD2, Q2. Each pair includes an input transistor QD1 (QD2) controlled by a voltage Vin+ (Vin−) of a differential signal to be amplified. The input transistor QD1 (QD2) controls another transistor Q1 (Q2) connected in cascade. The collector or drain nodes in common of the two Darlington transistors QD1, Q1 and QD2, Q2 that form the output nodes of the amplifier are coupled to a supply line VDD through respective load resistors RC1, RC2. The Darlington transistors are coupled between them through two identical emitter degeneration resistors RE1, RE2. These amplifiers are characterized by high gains approximately equal to the ratio between the load resistance RC1 (or RC2) and the emitter degeneration resistances RE1 (or RE2).

The resistors RC1 and RC2 are generally determined by external circuits connected to the amplifier, such as via a cable or an antenna. The resistors RC1 and RC2 cannot be modified. As a consequence, it is necessary to reduce the resistances RE1 and RE2 to increment the gain.

It is well known that the amplitudes of high order harmonics depend from a decreasing function of the normalized voltage drop $V_n$ on each emitter degeneration resistor:

$$V_n = \frac{IC1 \cdot RE1}{V_T}$$

where $V_T = kT/q$ is the thermal voltage. To summarize, the transfer characteristic of the amplifier is even more linear as the product between the collector current IC1 (or IC2) and the resistance RE1 (or RE2) increases. When values of the emitter resistance are chosen too small, this increases the current IC1 (or IC2) for a sufficiently linear transfer characteristic. Consequently, the power dissipated by the amplifier is increased.

SUMMARY OF THE INVENTION

An object of the invention is to provide a Darlington differential amplifier characterized by high gains and a reduced distortion of the amplified signal.

The third order harmonic distortion of the amplifier may be reduced without modifying substantially its gain by connecting a degeneration impedance between the Darlington transistors. The type and value of this impedance are design variables that are properly chosen for reducing the harmonic distortion at a given operating frequency.

More precisely, the invention provides a Darlington differential amplifier comprising a differential pair of Darlington transistors each composed of a first transistor controlled by an externally generated voltage and driving a second transistor in cascade. Degeneration impedances are connected between the emitter or source nodes of the second transistors.

The amplifier of the invention shows a more linear transfer characteristic with the same gain with respect to the known amplifiers because it comprises a second degeneration impedance for reducing the harmonic distortion of the differential amplifier. The second degeneration impedance is connected between the emitter or source nodes of the first transistors of the differential pair of Darlington transistors.

Preferably, the second degeneration impedance is composed of two identical resistive impedances electrically in series, and a current generator is connected between their common node and a ground node.

BRIEF DESCRIPTION OF THE DRAWINGS

The different aspects and advantages of the invention will be even more evident through a detailed description referring to the attached drawings, wherein.

DETAILED DESCRIPTION OF THE PREFERRED EMBODIMENTS

Figure 1:
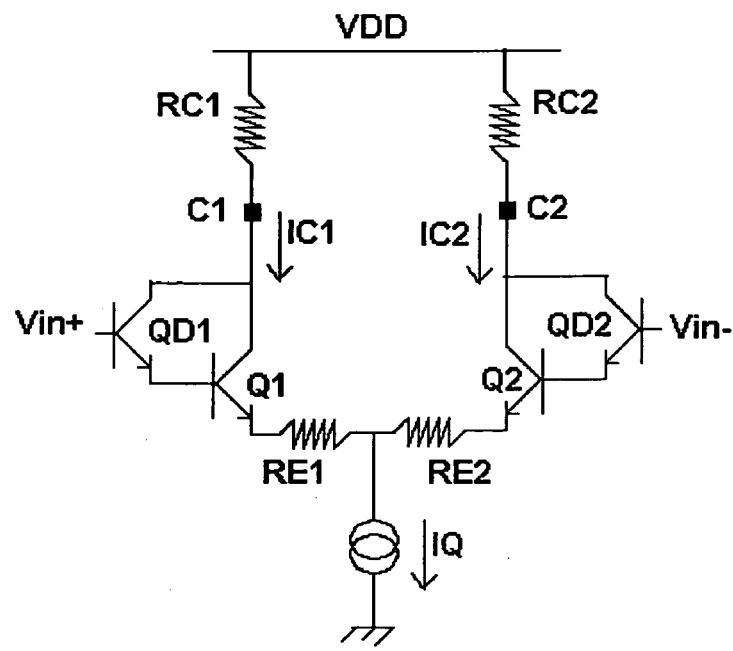
FIG. 1 is a schematic diagram of a Darlington amplifier according to the prior art.
Figure 2:
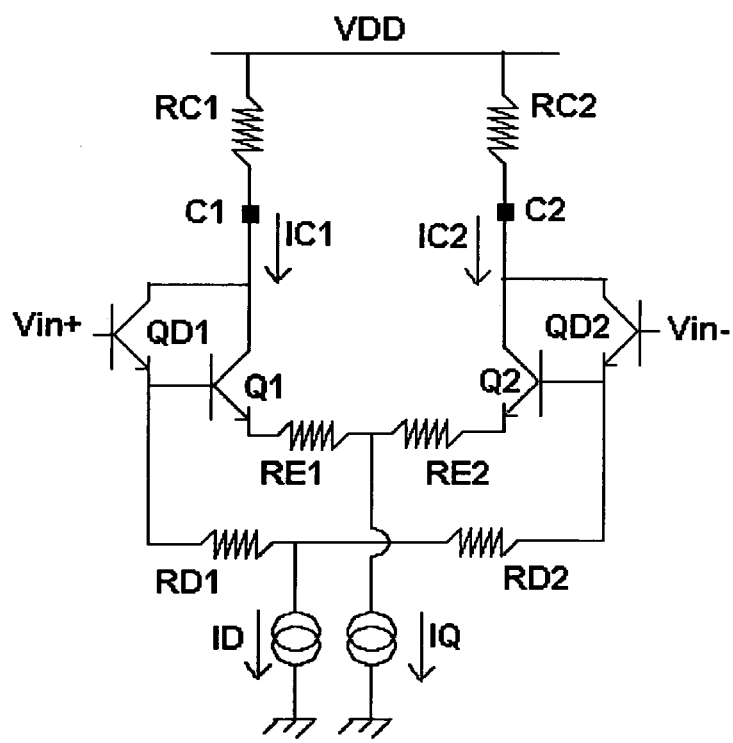
FIG. 2 is a schematic diagram of a preferred embodiment of a Darlington amplifier according to the invention.

An embodiment of a Darlington differential amplifier of the invention is depicted in FIG. 2. Differently from the known amplifier of FIG. 1, it has degeneration resistors RD1 and RD2 connected in series between the control nodes of the transistors Q1 and Q2. A current generator ID is connected between the common node to the two degeneration resistors and a ground node. In the shown example, bipolar transistors are used, but the same considerations also hold if the bipolar transistors are replaced with MOSFETs.

The harmonic distortion of the amplifier of the invention, that is the ratio in decibel between the amplitude of the third harmonic component and the amplitude of the fundamental harmonic of the output signal at a test frequency, may be reduced by appropriately choosing the degeneration resistances. This leaves practically unchanged the gain of the amplifier.

Figure 3:
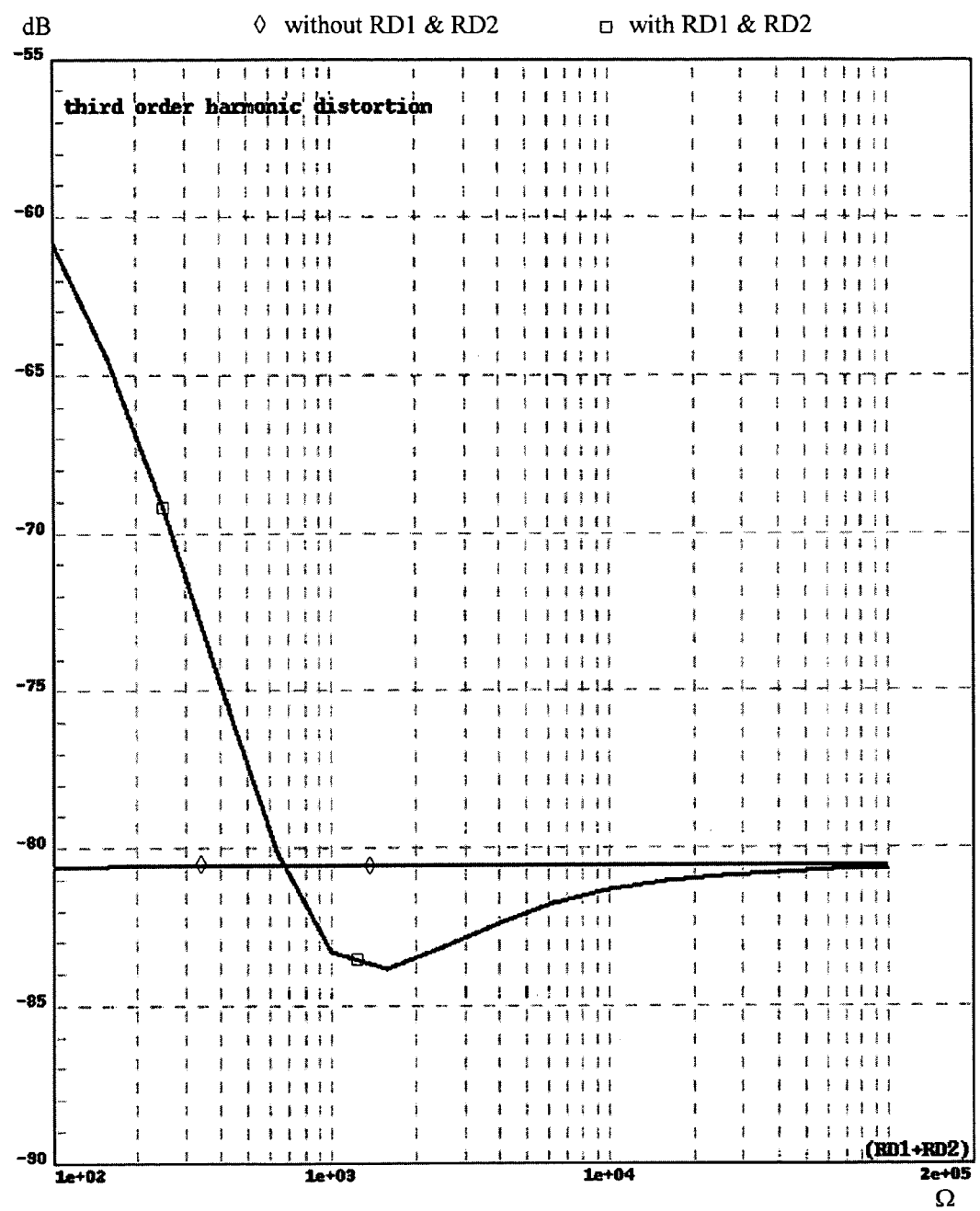
FIG. 3 is a graph of the third order harmonic distortion generated by the amplifier of FIG. 2 when the degeneration resistances vary.

The diagram of FIG. 3 shows a graph of the third order harmonic distortion (in decibel) as a function of the sum of degeneration resistors RD1 and RD2 for a low frequency (lower than 1 MHz) differential input signal Vin+, Vin−. This graph has been obtained by simulating the circuit of FIG. 2 with the following values:

RE1=RE2=100Ω; IQ=1 mA; ID=0.4 mA;

wherein the two resistors RD1 and RD2 are equal to each other.

As it is possible to infer from FIG. 3, for an additional total degeneration resistance RD1+RD2 smaller than 700Ω, the third order harmonic distortion is larger than that of the known circuit of FIG. 1, that is, about −81 dB. By increasing further the values of the resistors RD1, RD2, the third order harmonic distortion decreases down to a minimum of about −84 dB for values of the sum RD1+RD2 between 1 kΩ and 2 kΩ, and it tends asymptotically to the value of the circuit of FIG. 1. As a matter of fact, near the minimum an almost perfect cancellation of the third order harmonic takes place, but this is not highlighted in the graph because of the limited number of points considered for the simulation.

The gain of the amplifier is substantially unchanged, because it is essentially determined by the emitter degeneration resistances RE1, RE2 and by the load resistances RC1, RC2. The additional current generator ID is not indispensable, but it has been noticed that it contributes in reducing the harmonic distortion by choosing for it an optimal value determined by trial and error for each case.

According to an alternative embodiment, not depicted in the attached figures, instead of connecting the current generator ID as depicted in figure, it is possible to use two identical current generators ID/2 the value of which is half of that of the generator ID. Each current generator is connected between the ground node and a respective emitter (source) node of the transistors QD1 and QD2.

Figure 4:
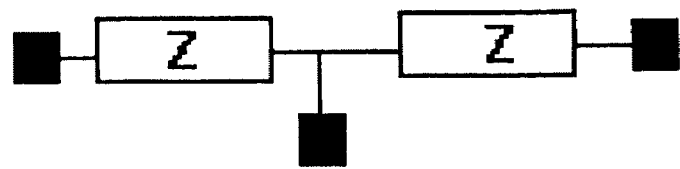
FIGS. 4, 5 and 6 show different degeneration impedance configurations for the amplifier of FIG. 2.
Figure 5:
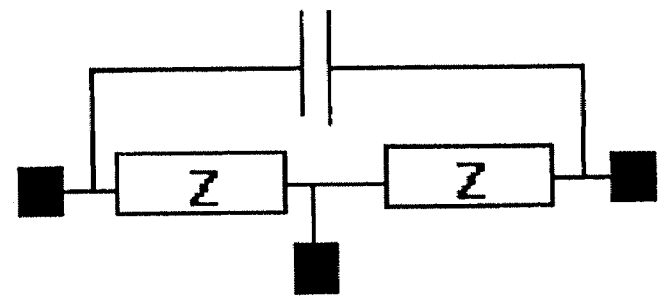
Figure 6:
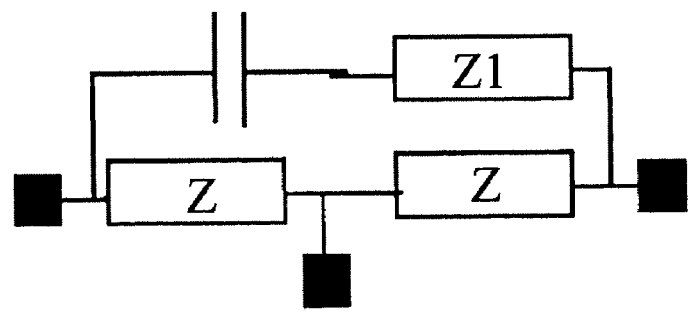

According to alternative embodiments of the invention, the degeneration impedances connected between the emitters of the transistors Q1, Q2 and QD1 and QD2 may be as depicted in FIGS. 4, 5 and 6. The impedances Z are resistive or inductive and are determined to reduce the third order harmonic distortion of the output signal at frequencies at which the amplifier shall operate.

As an alternative, the transistors Q1, Q2 and QD1, QD2 may have degeneration impedances as in the sample of FIG. 6, wherein the impedances Z1 and Z are resistive or inductive and may be different from each other.

That which is claimed is:

1. A Darlington differential amplifier comprising:
    a differential pair of Darlington transistors, each Darlington transistor comprising
        a first transistor and a second transistor connected in cascade to said first transistor, said first transistor being controlled by an externally generated voltage and driving said second transistor, said first and second transistors each comprising first and second conducting terminals, the first conducting terminals being connected together and forming an output node of the amplifier;
    a first degeneration impedance connected between the second conduction terminals of said second transistors in said pair of Darlington transistors, said first degeneration impedance comprising
        a pair of impedance elements connected together in series,
        a capacitor connected in parallel to said pair of impedance elements, and
        another impedance element connected in series with said capacitor and also connected in parallel to said pair of impedance elements; and
    a second degeneration impedance connected between the second conduction terminals of said first transistors in said pair of Darlington transistors for reducing harmonic distortion of the amplifier.

2. A Darlington differential amplifier according to claim 1, wherein said pair of impedance elements comprises resistors or inductors.

3. A Darlington differential amplifier according to claim 1, wherein said another impedance element comprises a resistor or an inductor.

4. A Darlington differential amplifier according to claim 1, wherein said second degeneration impedance comprises a pair of resistors or inductors connected together in series.

5. A Darlington differential amplifier according to claim 4, further comprising a capacitor connected in parallel to said pair of resistors or inductors.

6. A Darlington differential amplifier according to claim 5, further comprising a resistor or inductor connected in series with said capacitor and also connected in parallel to said pair of resistors or inductors.

7. A Darlington differential amplifier according to claim 4, wherein said pair of resistors or inductors are connected together at a common node; and further comprising a current generator connected between the common node and ground.

8. A Darlington differential amplifier according to claim 4, further comprising a pair of current generators connected between ground and a respective second conducting terminal of said first transistors in said pair of Darlington transistors.

9. A differential amplifier comprising:
    first and second pairs of transistors connected together, each pair of transistors comprising
        a first transistor and a second transistor connected in cascade to said first transistor, said first transistor driving said second transistor, said first and second transistors each comprising first and second conducting terminals, the first conducting terminals being connected together and forming an output node of the amplifier;
    a first degeneration impedance connected between the second conduction terminals of said second transistors; and
    a second degeneration impedance connected between the second conduction terminals of said first transistors for reducing harmonic distortion of the differential amplifier, said second degeneration impedance comprising
        a pair of impedance elements connected together in series,
        a capacitor connected in parallel to said pair of impedance elements, and
        another impedance element connected in series with said capacitor and connected in parallel to said pair of impedance elements.

10. A differential amplifier according to claim 9, wherein said first degeneration impedance comprises a pair of resistors or inductors connected together in series.

11. A differential amplifier according to claim 10, further comprising a capacitor connected in parallel to said pair of resistors or inductors.

12. A differential amplifier according to claim 11, further comprising a resistor or inductor connected in series with said capacitor and connected in parallel to said pair of resistors or inductors.

13. A differential amplifier according to claim 9, wherein said pair of impedance elements comprises resistors or inductors.

14. A differential amplifier according to claim 9, wherein said another impedance element comprises a resistor or an inductor.

15. A differential amplifier according to claim 13, wherein said pair of pair of resistors or inductors are connected together at a common node; and further comprising a current generator connected between the common node and ground.

16. A differential amplifier according to claim 13, further comprising a pair of current generators connected to between ground and a respective second conducting terminal of said first transistors.

17. A method for making a Darlington differential amplifier comprising:
forming a differential pair of Darlington transistors, each Darlington transistor comprising
a first transistor and a second transistor connected in cascade to the first transistor, the first transistor being controlled by an externally generated voltage and driving the second transistor, the first and second transistors each comprising first and second conducting terminals, the first conducting terminals being connected together and forming an output node of the amplifier;
connecting a first degeneration impedance between the second conduction terminals of the second transistors in the pair of Darlington transistors, the first degeneration impedance comprising
a pair of impedance elements connected together in series,
a capacitor connected in parallel to the pair of impedance elements, and
another impedance element connected in series with the capacitor and also connected in parallel to the pair of impedance elements; and
connecting a second degeneration impedance between the second conduction terminals of the first transistors in the pair of Darlington transistors for reducing harmonic distortion of the amplifier.

18. A method according to claim 17, wherein the pair of impedance elements comprises resistors or inductors.

19. A method according to claim 17, wherein the another impedance element comprises a resistor or an inductor.

20. A method according to claim 17, wherein the second degeneration impedance comprises a pair of resistors or inductors connected together in series.

21. A method according to claim 20, further comprising connecting a capacitor in parallel to the pair of resistors or inductors.

22. A method according to claim 21, further comprising connecting a resistor or inductor in series with the capacitor and also in parallel to the pair of resistors or inductors.

23. A method according to claim 20, wherein the pair of resistors or inductors are connected together at a common node; and further comprising connecting a current generator between the common node and ground.

24. A method according to claim 20, further comprising connecting a pair of current generators between ground and a respective second conducting terminal of the first transistors in the pair of Darlington transistors.

* * * * *